(12) United States Patent
Mascolo et al.

(10) Patent No.: US 7,067,341 B2
(45) Date of Patent: Jun. 27, 2006

(54) SINGLE ELECTRON TRANSISTOR MANUFACTURING METHOD BY ELECTRO-MIGRATION OF METALLIC NANOCLUSTERS

(75) Inventors: Danilo Mascolo, Ercolano (IT); Rossana Scaldaferri, Sapri (IT); Teresa Napolitano, Cimitile (IT); Valeria Casuscelli, Arzano (IT); Luigi Occhipinti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 114 days.

(21) Appl. No.: 10/695,479

(22) Filed: Oct. 28, 2003

(65) Prior Publication Data

US 2005/0090081 A1 Apr. 28, 2005

(51) Int. Cl.
*H01L 21/00* (2006.01)

(52) U.S. Cl. .......................................... 438/48; 438/969

(58) Field of Classification Search .................. 438/48, 438/77, 82, 93, 488, 489, 572, 590, 767, 438/969
See application file for complete search history.

(56) References Cited

U.S. PATENT DOCUMENTS

| | | | |
|---|---|---|---|
| 5,997,958 A | 12/1999 | Sato et al. .................. 427/468 |
| 6,057,556 A | 5/2000 | Gubin et al. ................... 257/39 |
| 6,313,479 B1 | 11/2001 | Zhang et al. .................. 257/14 |
| 6,447,887 B1 * | 9/2002 | Claus et al. ................. 428/209 |
| 6,538,801 B1 * | 3/2003 | Jacobson et al. ........... 359/296 |
| 6,579,463 B1 * | 6/2003 | Winningham et al. ........ 216/41 |
| 6,721,083 B1 * | 4/2004 | Jacobson et al. ........... 359/296 |
| 2003/0048619 A1 | 3/2003 | Kaler et al. .................. 361/760 |
| 2003/0102444 A1 | 6/2003 | Deppert et al. ........ 250/492.22 |

FOREIGN PATENT DOCUMENTS

WO    WO 03/016209 A1    2/2003

OTHER PUBLICATIONS

Hori, M., et al., "Sub–5 nm Gold Dot Formation Using Retarding–Field Single Ion Deposition," *Applied Physics Letters* 73(22):3223–3225, Nov. 30, 1998.

* cited by examiner

*Primary Examiner*—David Nhu
(74) *Attorney, Agent, or Firm*—Lisa K. Jorgenson; Hai Han; Seed IP Law Group PLLC

(57) ABSTRACT

A method manufactures a single electron transistor device by electro-migration of nanocluster wherein said nanoclusters are metallically passivated and forced to assembly over a lithographic patterned substrate under control of a non homogeneous electric field at room temperature. A controlled migration and the desired location of the metallic passivated nanoclusters are based on a dielectrophoretic process.

35 Claims, 12 Drawing Sheets

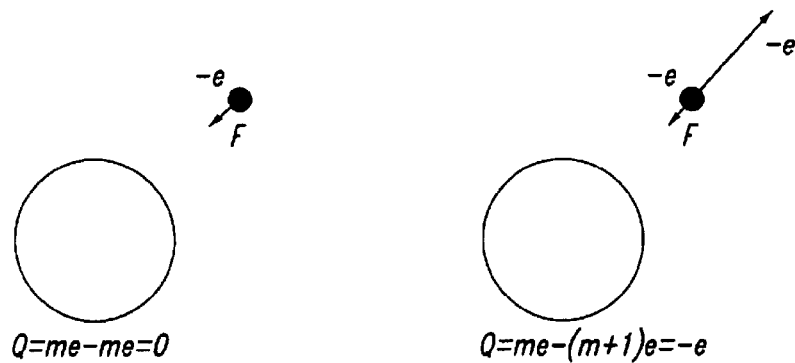
FIG. 1A
(Prior Art)
FIG. 1B
(Prior Art)
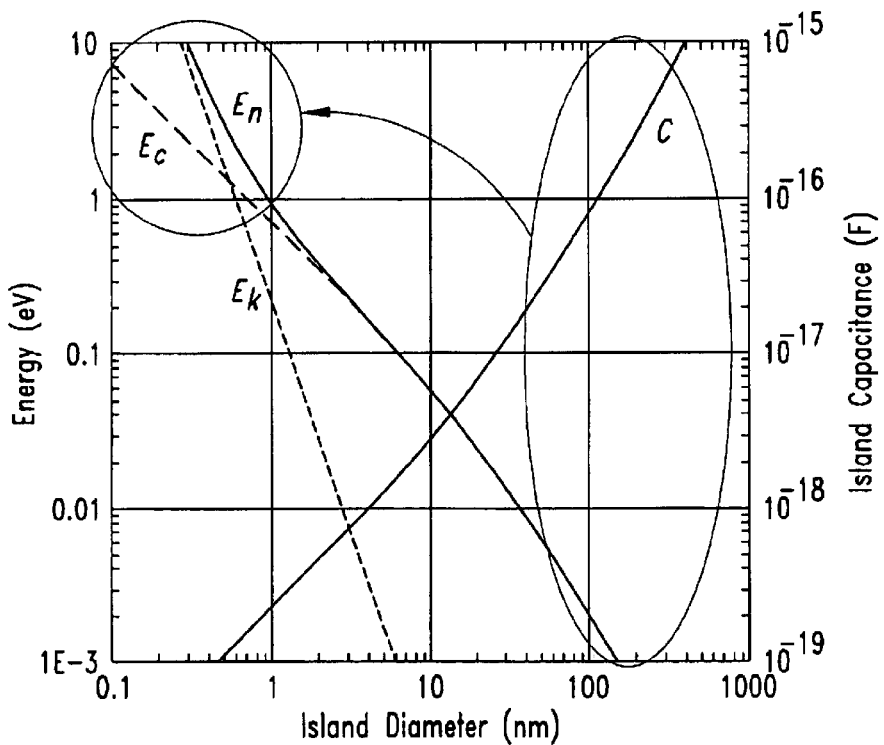
FIG. 2
(Prior Art)

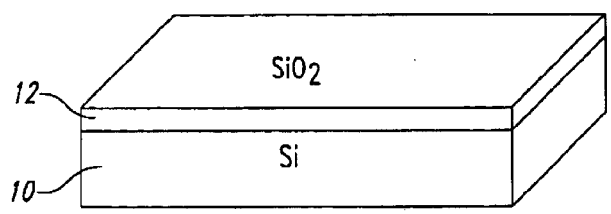 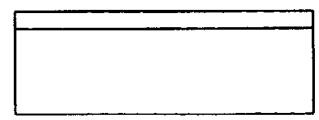
*FIG. 14A*          *FIG. 14B*
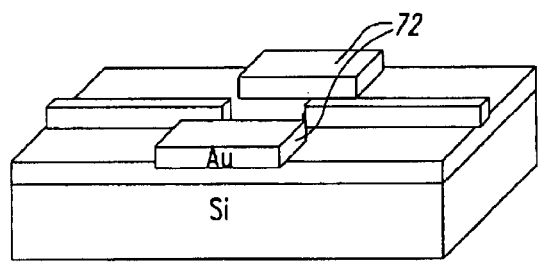 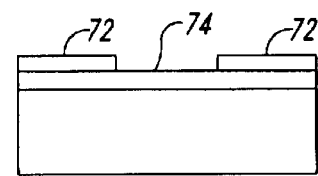
*FIG. 15A*          *FIG. 15B*
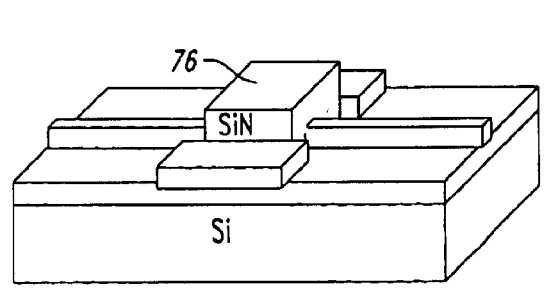 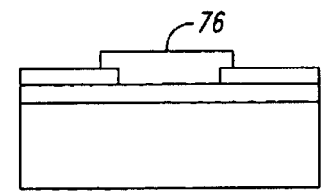
*FIG. 16A*          *FIG. 16B*

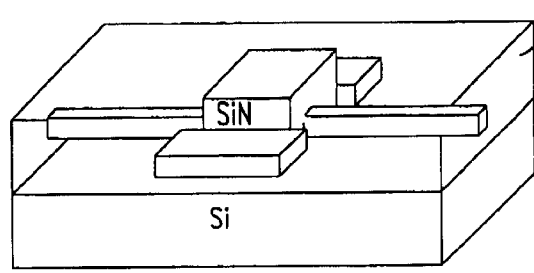
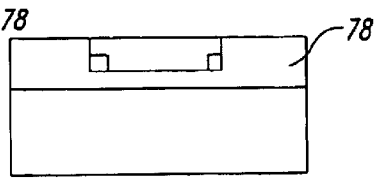
*FIG. 17A*      *FIG. 17B*
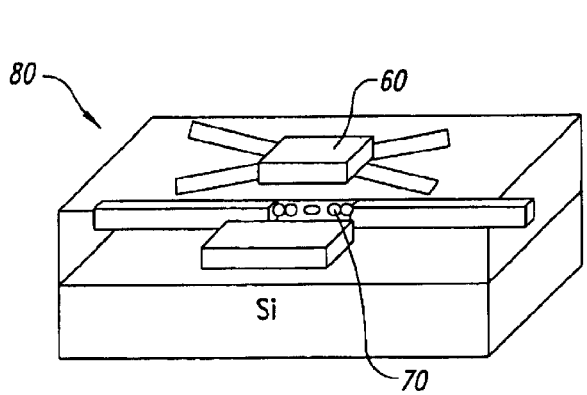
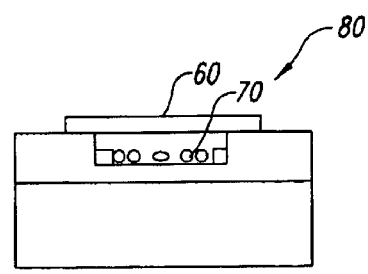
*FIG. 18A*      *FIG. 18B*

SINGLE ELECTRON TRANSISTOR MANUFACTURING METHOD BY ELECTRO-MIGRATION OF METALLIC NANOCLUSTERS

BACKGROUND OF THE INVENTION

1. Field of the Invention

The present invention relates to a manufacturing method for obtaining a single electron transistor by electro-migration of nanocluster.

More specifically, the invention relates to a method for manufacturing a single electron transistor by electro-migration of nanocluster

2. Description of the Related Art

To fully understand all the aspects of the present invention reference is made to the enclosed FIGS. 1–4 showing known examples of single-electron devices.

The enclosed FIG. 1 illustrates the basic concept of single-electronics.

Let's first consider a small electroneutral conductor, traditionally called an island, having exactly as many (m) electrons as protons in its crystal lattice.

In this electroneutral state the island does not generate any appreciable electric field beyond its borders, and a even weak external force $\vec{F}$ may bring in an additional electron from outside. In most single-electron devices, this injection is carried out by a tunneling effect through an energy barrier created by a thin insulating layer. Now, after this injection, the net charge Q of the island would be (−e), and the resulting electric field E would repulse any further electron that might be added.

Though the fundamental charge is very small in absolute value (e≈1.6×10$^{-19}$ Coulomb), the electric field E that it generates is inversely proportional to the square of the island size, and may become rather strong for nanoscale structures. For example, the electric field is as large as ~140 kV/cm on the surface of a 10-nm sphere in vacuum.

The theory of single-electron phenomena shows that a more adequate measure of the strength of these effects is not the electric field, but the charging energy.

$$E_c = e^2/C \quad (1)$$

where C is the capacitance of the island. When the island size becomes comparable with the de Broglie wavelength of the electrons inside the island, their energy quantization becomes substantial. See for instance the articles by: M. A. Kastner, "Artificial Atoms", *Physics Today*, vol. 46, pp. 24–31, January 1993; or U. Meirav and E. B. Foxman, "Single-Electron Phenomena In Semiconductors", *Semicond. Sci. Technol.* vol. 10, pp. 255–284, October 1995.

In this case the energy scale of the charging effects is given by a more general notion, the electron addition energy $E_a$. In most cases of interest, $E_a$ may be well approximated by the following simple formula:

$$E_a = E_c + E_k \quad (2)$$

Wherein $E_C$ is given by equation (1) and $E_k$ is the quantum energy of the added electron; for a degenerate electron gas the quantum energy is:

$$E_k = 1/g(E_F)V \quad (3)$$

where V is the island volume and $g(E_F)$ is the density of states on the Fermi surface.

FIG. 2 shows the total electron addition energy as a function of the island diameter, as calculated using Eq. (2) for a simple but representative model.

For 100-nm-scale devices which were typical for the initial stages of experimental single-electronics, $E_a$ is dominated by the charging energy $E_c$ and is of the order of 1 meV, i.e., ~10 K in temperature units.

Since thermal fluctuations suppress most single-electron effects unless $E_a \geq 10\ k_B T$, these experiments have to be carried out in the sub-1-K range (typically, using helium dilution refrigerators). On the other hand, if the island size is reduced below ~10 nm, $E_a$ approaches 100 meV, and some single-electron effects become visible at room temperature.

However, most suggested digital single-electron devices require even higher values of $E_a$ (≈100 $k_B T$) in order to avoid thermally-induced random tunneling events, so that for room temperature operation the electron addition energy $E_a$ has to be as large as a few electron-volts, and the minimum feature size of single-electron devices has to be smaller than ~1 nm, as shown in the diagram of FIG. 2.

In this FIG. 2 a single-electron addition energy Ea is shown as a solid line, while the charging energy Ec is shown as dashed line and the electron kinetic energy $E_k$ as dotted line, all calculated using Eqs. (1) and (2) for a simple model of a conducting island. In such a model the island is a round 3D ball with a free, degenerate electron gas, embedded into a dielectric matrix (dielectric constant e=4), with 10% of its surface area occupied by tunnel junctions with a barrier thickness d=2 nm. Reference is made to K. K. Likharev, Proc. IEEE, vol. 87, pp. 606–632, April 1999.

In this size range the electron quantization energy $E_k$ becomes comparable with or larger than the charging energy $E_c$ for most materials; this is why islands of these small sizes are frequently called quantum dots. Their use involves not only extremely difficult nanofabrication technology (especially challenging for large scale integration), but also some major physics problems including the high sensitivity of transport properties to small variations of the quantum dot size and shape. This is why it is very important to develop single-electron devices capable of operating with the lowest possible ratio $E_a/k_B T$.

Some examples of single electron devices have been studied and are reported in literature. The following paragraphs will briefly summarize a couple of these devices as state-of-the art technologies for SET, while the article by K. K. Likharev reports the basic theoretical background and physical principles governing the SET functioning.

The simplest device that shows single electron phenomena is the "single-electron box" like that shown in FIG. 3a, and reported by K. K. Likharev. This device comprises just one small island separated from a larger electrode ("electron source") by a tunnel barrier. An external electric field may be applied to the island using another electrode ("gate") separated from the island by a thicker insulator, which does not allow noticeable tunneling. The field changes the electrochemical potential of the island and thus determines the conditions of electron tunneling.

This device allowed to verify experimentally the phenomenon, known as "Coulomb staircase", which is gradually smeared out by thermal fluctuations if the temperature is increased to $k_B T \approx E_c$.

Coulomb staircase is a very simple physic phenomenon: increasing gate voltage U attracts more and more electrons to the island. The discreteness of electron transfer through low transparency barriers necessarily makes this increase step-like. Then even such a simple device allows a reliable addition/subtraction of single electrons to/from an island with an enormous (and unknown) number of background electrons, of the order of 1 million in typical low-temperature experiments with 100-nm-scale aluminum islands.

This is of course simply a consequence of the enormous strength of the unscreened Coulomb interaction occurring at low temperatures and, in fact, is the main limitation for the physical implementation of such a kind of single electron devices that are fabricated by scaling down the feature sizes from conventional microelectronics technologies.

Splitting the tunnel junction of the single electron box and applying a dc voltage V between the two, now separate, parts of the external electrode allows obtaining the structure of FIG. 4a. The resulting "single-electron transistor" is probably the most important device in this technical field. In fact, there have been several studies and experimental analysis carried out on this device by some major research organizations in the physics and nanotechnology field.

The expression for the electrostatic energy W of the system is:

$$W=(ne-Q_e)^2/2C_\Sigma-eV[n_1C_1+n_2C_2]+const \quad (4)$$

Here $n_1$ and $n_2$ are the number of electrons passed through the tunnel barriers 1 and 2, respectively, so that $n=n_1-n_2$, while the total island capacitance $C_\Sigma$ is now a sum of $C_0$, $C_1$, $C_2$, and whatever stray capacitance the island may have. The external charge $Q_e$ is defined by the equation $$Q_e=UC_0 \quad (5)$$

and is just a convenient way to present the effect of the gate voltage U.

Capacitive-coupled single-electron transistor: (a) schema, (b) source-drain dc I-V curves of a symmetric transistor for several values of the Qe, i.e., of the gate voltage, and (c) the Coulomb blockade threshold voltage $V_t$ as a function of $Q_e$ at T→0.

FIG. 4b shows typical dc I-V curves of this system. At small source-drain voltage $V_t$ there is no current, since any tunneling event would lead to an increase of the total energy ($\Delta W<0$) and hence at low enough temperatures ($k_BT<<E_c$) the tunneling rate is exponentially low. This suppression of dc current at low voltages is known as the Coulomb blockade. At a certain threshold voltage $V_t$ the Coulomb blockade is overcome, and at much higher voltages the dc I-V curve gradually approaches one of the offset linear asymptotes:

$$I\rightarrow(V+sign(V)\cdot(e/2C_\Sigma))/(R_1+R_2)$$

On its way, the I-V curve exhibits quasi-periodic oscillations of its slope, closely related in nature to the Coulomb staircase in the single-electron box, and expressed especially strongly in the case of a strong difference between $R_1$ and $R_2$.

The most important property of the single-electron transistor is that the threshold voltage, as well as the source-drain current in its vicinity, is a periodic function of the gate voltage. This periodicity is evident from Eqs. (4) and (5): if U is changed by $\Delta U=e/C_0$, $Q_e$ changes by e, and may be exactly compensated for by one of the electrons tunneling into or from the island.

As the transistor island becomes smaller, the effects of energy quantization may become important. The theory shows that its dc I-V curves may be quite complex, as disclosed by D. V. Averin, A. N. Korotkov, and K. K. Likharev, "Theory Of Single-Electron Charging Of Quantum Wells And Dots", *Phys. Rev. B, vol.* 44, pp. 6199–6211, September 1991.

However, the situation at small source-drain voltage is much simpler. In fact, FIG. 4c shows that on each period of the Coulomb blockade oscillations there is one special point:

$$Q_e=e(n+\tfrac{1}{2})$$

at which the Coulomb blockade is completely suppressed, and the I-V curve has a finite slope at low voltages (see FIG. 4b).

Another way to express the same property is to say that the linear conductance $G=dI/dV|_{V=0}$ of the transistor as a function of the gate U voltage exhibits sharp peaks. Theory shows that even if the electron quantization effects are substantial, the peak position may be found from a very natural "resonance tunneling" condition as disclosed by H. van Houten, C. W. J. Beenakker, and A. A. A. Staring, "Coulomb Blockade Oscillations In Semiconductor Nanostructures", in: *Single Charge Tunneling*, ed. by H. Grabert and M. H. Devoret. New York: Plenum, 1992, pp. 167–216; and by C. W. J. Beenakker, "Theory of Coulomb-blockade oscillations in the conductance of a quantum dot", *Phys. Rev. B*, vol. 44, pp. 1646–1656, July 1991.

So, an energy level inside the island (with the account of the gate field potential) should be aligned with the Fermi levels in source and drain, which coincide at V→0. This rule yields a simple equation for the gate voltage distance between the neighboring Coulomb blockade peaks:

$$\Delta U=(C_\Sigma/C_0)E_d/e \quad (6)$$

Fabrication of SET promotes many difficulties for this device to be used in a large scale industrial production, since:

It is vitally important to develop technologies to realize nanoscale Quantum Dots (QD) and quantum wires, which are coupled together through tunneling barrier, and which must be precisely controlled in their size and position.

Process induced damage and contamination must be avoided in the fabrication of large scale SET circuits.

The technique must have high reproducibility and controllability.

Basically the fabrication methods can be divided as physical or chemical techniques according to the main procedures.

The physical methods often utilize the combination of thin film and lithographic technologies.

Devices with carefully tailored geometries and electron density are obtained. For example, quantum dots or quasi-zero-dimensional puddles of electrons with weak coupling to simultaneously patterned electrical leads are fabricated to form a SET. However, lithographic and materials limitations restrict the minimum size and composition of such dots (100 nm), and studies are typically limited to sub-Kelvin temperatures.

Another possible approach is to grow nanostructures chemically as reported by David L. Klein, Paul L. McEuen, etc., in *Appl. Phys. Lett.*, v68, 1996, p2575.

This approach is prosperous for its low cost and good controllability of the size of Coulomb islands, and it is possible to be a prospective technique.

Though this technique is not mature industrially, the SETs fabricated in laboratories show fascinating results.

Generally there are three most important steps:

first, the fabrication of Coulomb islands as well as the control of their size and dispersity;

second, the formation of tunneling junctions at the joint of electrodes and Coulomb island;

third, the formation of gate between substrate and Coulomb islands.

BRIEF SUMMARY OF THE INVENTION

An embodiment of the present invention is that of providing a new and original solution for the manufacturing of SET working at room temperatures.

An embodiment of the present invention develops SET devices working preferably, but not necessarily, at room temperature using a new technology process and building up a set of nanocontacts that can be self-assembled and able to maintain a separation distance in the ~10 nm range, including as well a quantum dot made up of a single nanoparticle, which can be sized in the same range.

More specifically, the embodiment employs a patterned substrate over which nanoclusters are forced to assemble under the control of a not homogeneous electric field. The substrate may be patterned by a lithographic technique or by other techniques such a SAM (Self Assembled Monolayers); MicroPrinting or DNA-Scaffolding. Moreover, the substrate could be a polymeric substrate; glass or ITO; that is: a non-silicon substrate.

The controlled migration and the desired location of the metallic passivated nanoclusters are based on the a dielectrophoretic process, which is known by itself but has never been applied in this field.

A first embodiment of the invention relates to a method for manufacturing a single electron transistor device by electro-migration of nanocluster wherein said nanoclusters are metallic passivated and forced to assemble over a patterned substrate under control of a non-homogeneous electric field; preferably at room temperature.

Moreover, the controlled migration and the desired location of the metallic passivated nanoclusters are based on a dielectrophoretic process.

The feature and advantages of a manufacturing method according to the invention will be apparent from the following description of an embodiment thereof, given by way of non-limitative example with reference to the accompanying drawings.

BRIEF DESCRIPTION OF THE DRAWINGS

FIG. 1 shows the basic concept of single-electron control: a conducting island (a) before and (b) after the addition of a single electron. The addition of a single uncompensated electron charge creates an electric field E that may prevent the addition of the following electrons.

FIG. 2 Single-electron addition energy Ea (solid line), charging energy Ec (dashed line) and electron kinetic energy Ek (dotted line), as calculated using Eqs. (1) and (2) for a simple model of a conducting island. In this model the island is a round 3D ball with a free, degenerate electron gas, embedded into a dielectric matrix (dielectric constant e=4), with 10% of its surface area occupied by tunnel junctions with a barrier thickness d=2 nm;

FIGS. 14A and 14B–18A and 18B depict a scheme of a process to build up the SET microcavity.

DETAILED DESCRIPTION OF THE INVENTION

Figure 3A:
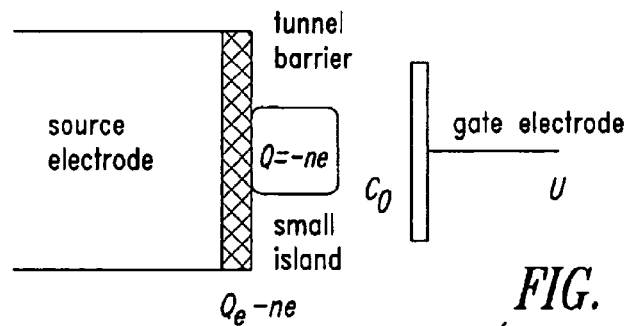
FIG. 3 shows a single-electron box: (a) schema, (b) particular geometry, (c) step-like dependence of the average charge Q=−ne on the gate voltage, for several values of temperature.
Figure 3B:
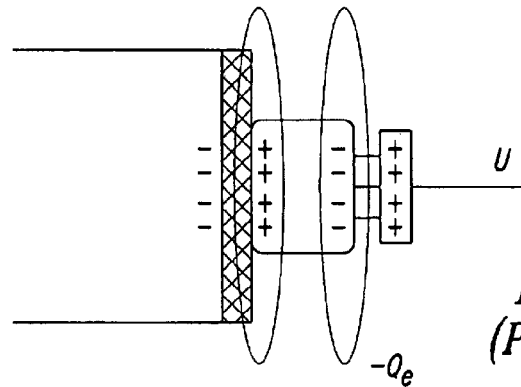
Figure 3C:
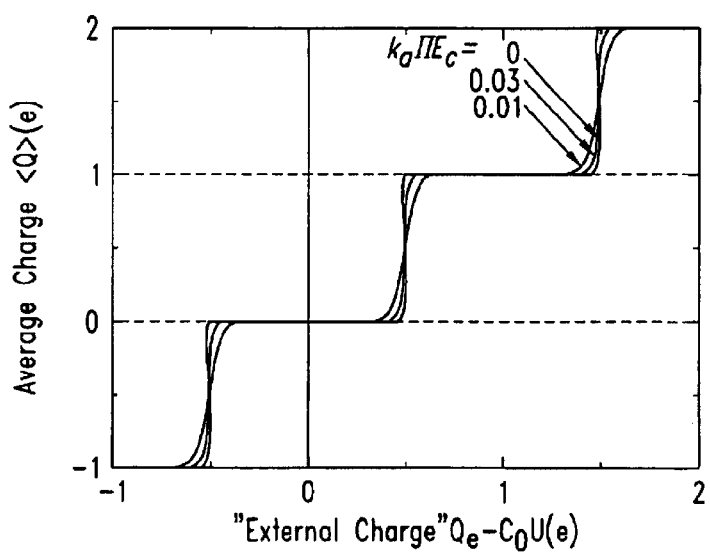
Figure 4A:
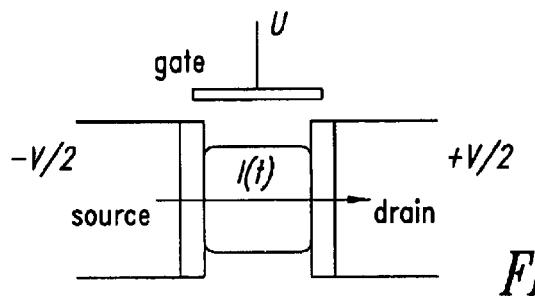
FIG. 4 shows a capacitive-coupled single-electron transistor: (a) schema, (b) source-drain dc I-V curves of a symmetric transistor for several values of the Qe, i.e., of the gate voltage, and (c) the Coulomb blockade threshold voltage $V_t$ as a function of $Q_e$ at T→0.
Figure 4B:
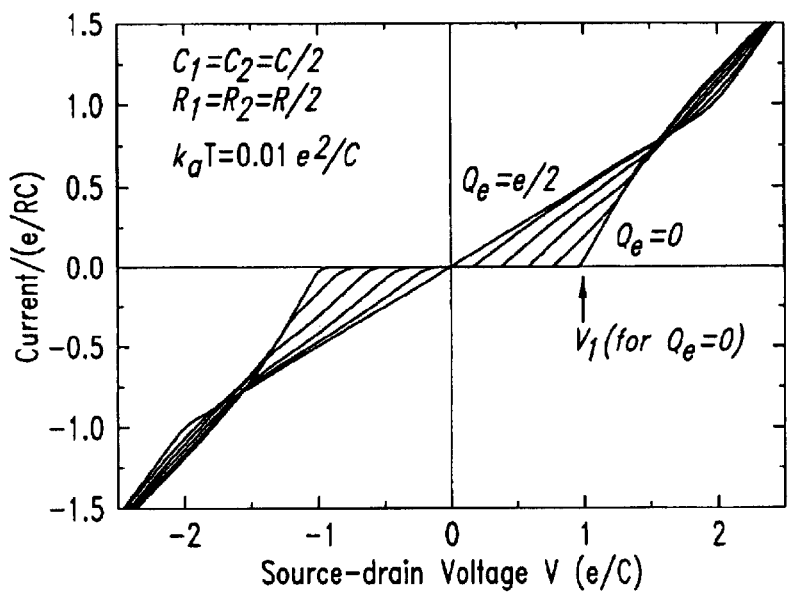
Figure 4C:
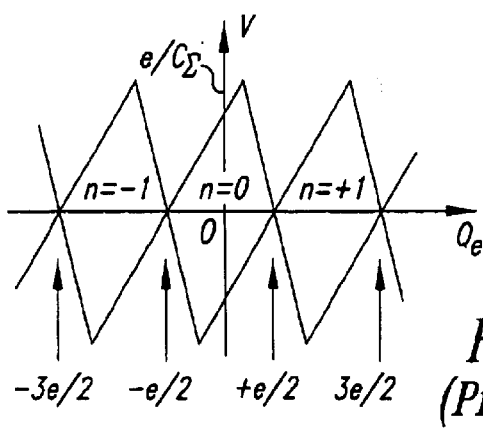

The idea is to realize a SET device working at room temperature, employing a lithographically patterned substrate over which nanoclusters are forced to assemble under the control of a non-homogeneous electric field. The controlled migration and the desired location of the metallic passivated nanoclusters are based on the a dielectrophoretic process, which is well-known by itself but has never been applied in this field.

FIRST EXAMPLE

1. Realization of a Patterned Substrate

On a semiconductor substrate 10, for instance a silicon substrate with a silicon oxide layer 12 formed thereon, a rectangular central aperture 14, paths 16 for metallic contacts, and peripheral apertures 18 are opened, leaving a thickness of the oxide layer 12 over the Si substrate 10.

More particularly, the depth of the aperture can be about three times its width. A high conductive metallic layer 20, for instance a gold layer, is deposited on the contact paths 16 and in the peripheral apertures 18 to form contact pads 22 without invading the central aperture 14.

Then an oxide layer 24 is deposited on the contact links between the central aperture 14 and the pads 22. Thus, the pads 24 are free-contact surfaces, four in this example, that are available as electrodes for the dielectrophoresis control.

Figure 5A:
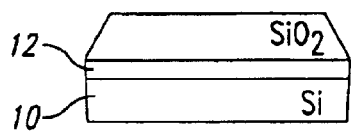
FIGS. 5A, 5B, 5C schematically show process steps for realizing a patterned semiconductor substrate.
Figure 5B:
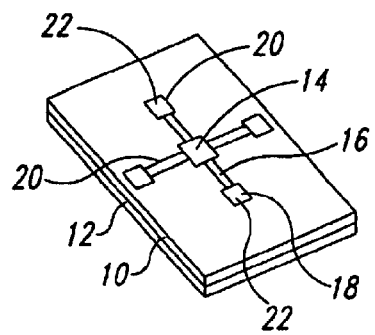
Figure 5C:
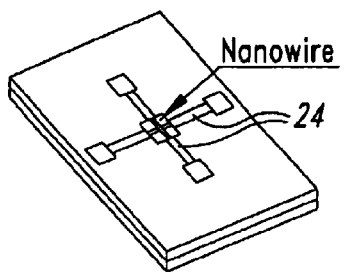
Figure 6A:
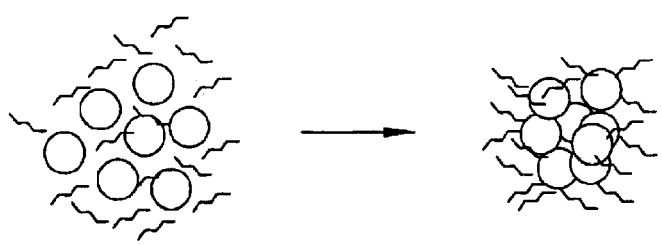
FIGS. 6A and 6B are schematic views of an example of nanoclusters passivation.
Figure 6B:
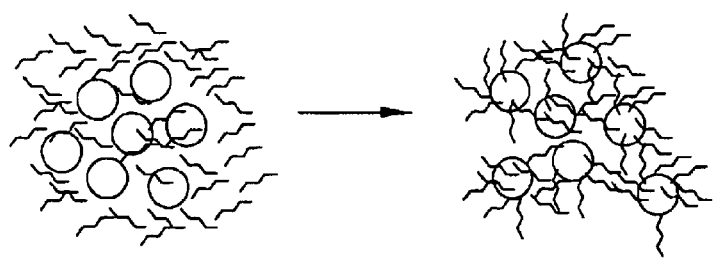
Figure 7:
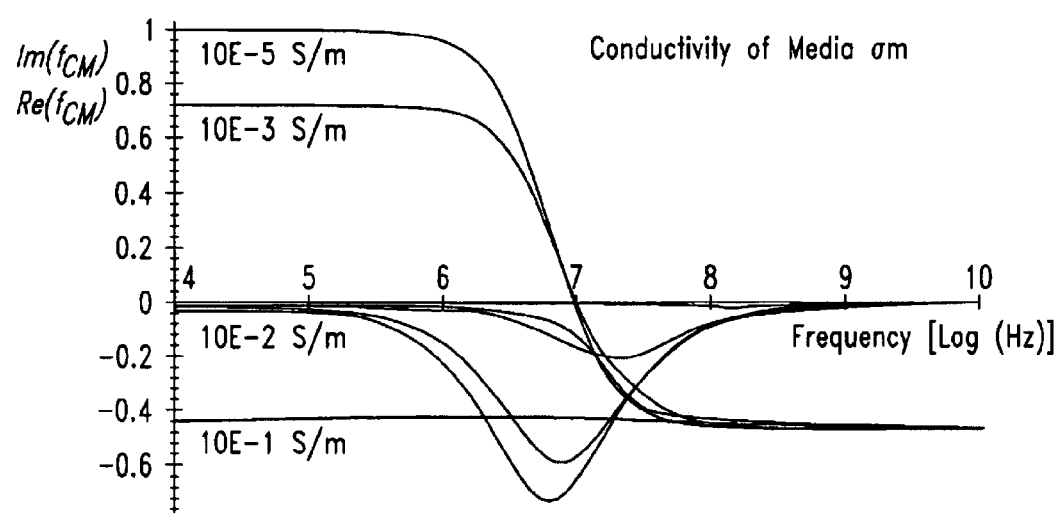
FIG. 7 is a schematic diagram showing the Real part and Imaginary part of $f_{CM}$ as function of frequency.

The described patterned process steps are schematically shown in FIGS. 5A, 5B, 5C.

Deposition of Nanoclusters by Dielectrophoresis Process

By this technique it will be possible to deposit metal nanowires on whatever substrate at relatively low temperature and with low cost. It exploits metallic nanoclusters as building blocks to grow up nanowires, under the control of an external electric field.

The technologies in use for nanowires production employ expensive and sophisticated process.

The main well-known competing methods to fabricate nanowires in general can be grouped in the following categories:

lithography;

deposition into tracks of high-energy particles n polymer;

deposit of onto step-edge and STM manipulation;

The disadvantages of these techniques have been widely discussed in the past.

In the latest years other techniques have been developed for nanowires realization:

filling nanotubes with metal atoms, as disclosed by Braun et al., in Nature 391, 775, (1998);

loading DNA with silver and selective electro-deposition onto MBE-grown template, as disclosed by G. Fasol, K. Runge, Appl. Phys. Lett. 70, 2467, (1997).

The first method has a great disadvantage due to the fact that metal reacts chemically with carbon tube walls and the research of remedies is in running.

In the second method instead, only some kind of metals can be processed to fabricate nanowires.

Another possible way employs the electrical properties of some carbon nanotubes like "armchair" SWNT but nowadays lots of difficulties are connected to the controlled synthesis of this kind of carbon structures and the research in this field is in running at present.

An embodiment of the inventive process develops in three steps:

1. Synthesis of metallic nanoclusters surrounded by a dielectric shell of thioles of controlled size;
2. Deposition of the nanoclusters by dielectrophoresis;
3. Sintering of the nanoclusters in a nanowire after desorbation of the bonded dielectric shell as result of heating.

Let's evaluate each of the above steps in the following lines.

1. Synthesis of Metallic Nanoclusters

This first step concerning the synthesis of metallic nanoclusters can be performed in three process steps:

a) Synthesis of active metal
b) Superficial passivation with thiol
c) Extraction and purification a) Synthesis of active metal The process for the preparation of finely divided powders of easily reducible metals is the polyol process.

In this process a suitable solid inorganic compound is suspended in liquid polyol. The suspension is stirred and heated to a given temperature that can reach the boiling point of the polyol for the less easily reducible metals.

The reduction of the starting compound quantitatively yields the metal as a finely divided powder. This starting compound may be a hydroxide, an oxide, and a convenient salt. The reduction to metal can be achieved in various polyols but ethylene glycol (EG), and diethylene glycol (DEG) have been mainly used. The reduction reaction proceeds in polyvinylpyrrolidone (PVP, Aldrich $M_w$ 10000) that acts as reducing agent and inhibitor of aggregation process nanoclusters formed.

The reaction proceeds in two stages that are described in following:

$1^{st}$ stage Crystallized metal compound→intermediate phase
  Progressive dissolution of a metal compound, said metal compound is metal hydroxide, metal oxide or metal salt;
  Precipitation of the intermediate phase;
  Evolution of water by distillation.

$2^{nd}$ stage Intermediate phase→metal
  Dissolution of intermediate phase;
  Reduction in solution;
  Evolution of volatile products of reaction;
  Spontaneous nucleation and growth of metal particles.

The main feature of this reaction mechanism is that the reduction reaction proceeds via the solution rather than in the solid state. Therefore, the metal particles are formed by nucleation and growth from the solution. This main feature is quite general for all investigated reaction and for all metals obtained by this polyol process.

According to this mechanism, the polyol acts first as a solvent for the starting inorganic compound. The occurrence in the system of an intermediate solid phase between the starting material and the final metal powder is not quite general but is very frequently observed.

During the second stage of the reaction mechanism the redissolution of the intermediate solid phase takes place and the reduction of the metal species occurs in the liquid phase.

The whole reaction can be so formulated:

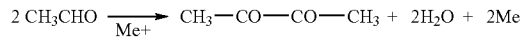

The metal is generated in the liquid phase and when the supersaturation is high enough, nucleation and growth occur. The metal particles are isotropic; the homogeneous nucleation model explains these characteristics with an effective separation between the nucleation and growth steps.

The growth parameters of the chemical synthesis allow to control the size of the metallic core while the kind of thiol $(CH_3(CH_2)_nSH)$, and in particular the number n of the groups ($—CH_2—$) defines the thickness of the shell and therefore the size of the conductive barrier and the linear resolution of the process. In some embodiments of the invention, n is an integer ranging from 2–30, but the invention is not limited to thiols within that range.

The reaction temperature influences the morphological characteristics of the metal particles. As a general rule a decrease of the mean size is observed as the reaction temperature increases.

b) Superficial passivation with thiol

The metallic nanoclusters are stabilized by superficial treatment via thiol.

The metallic suspension is cooled and treated at room temperature with a dodecanthiol $(CH_3(CH_2)_{11}SH)$ solution or with a thiol excess $(CH_3(CH_2)_nSH)$.

A concentrated solution is prepared by adding to suspension of clusters and PVP. Thiol molecules are chemically absorbed to the clusters surface following the reaction:

c) Extraction and purification

The metallic nanoclusters are separated by extraction with hydrocarbon (wet-way process) or for addition of water on following filtration (dry-way process). Hexane is mainly used as hydrocarbon for the wet-way process. The metallic nanoclusters are purified for dissolution in ethyl alcohol and precipitation with acetone. The precipitation product is separated by centrifugation and air-dried.

2. Dielectrophoresis

Dielectrophoresis (DEP) is defined as the motion of neutral, polarizable matter produced by a non-uniform electric (AC or DC) field, see for instance the work of H. A. Pohl, "Dielectrophoresis", Cambridge University Press, Cambridge, 1978.

It must be noted that dielectrophoresis is fully distinguished from electrophoresis, which is the motion of charged particle in a uniform electric field.

The principle of DEP lies in the fact that a net force can arise upon even a neutral particle situated in a non-uniform electric field. In particular, when a particle suspended in a medium becomes electrically polarized as result of the interaction with an external electric field, a force acts on the particle. This force can be thought of as rising from the imaginary two step process of induction or alignment of an electric dipole in the particles followed by unequal forces of the end of that dipole. Since the two equally charged ends of the dipole lie in unequal field strengths of the diverging field, a net force arises.

The DEP-induced particle motion is strongly dependent on the field frequency, the spatial configuration of the electrodes responsible of field generation, the dielectric properties of the suspended medium and of the particle itself.

A small neutral particle at equilibrium in a static electric field experiences a net force due to that can be written as:

$$\vec{F}_{DEP} = (\vec{p} \cdot \vec{\nabla}) \vec{E} \qquad (7)$$

where $\vec{p}$ is the dipole moment and $\vec{E}$ is the external electric field.

If the particle is a dielectric, isotropically, linearly and homogenously polarizable, then $$\vec{p} = \alpha v \vec{E} \qquad (8)$$

where $\alpha$ is the polarizability and $v$ is the particle volume. Then the force can be rewritten as:

$$\vec{F}_{DEP} = \alpha v (\vec{E} \cdot \vec{\nabla}) \vec{E} = \frac{1}{2} \alpha v \vec{\nabla} |\vec{E}|^2 \qquad (9)$$

So, this force equation can now be used to find force in a model system such as that of a dielectric sphere (relative complex permittivity $$\varepsilon_p^* = \varepsilon_p - j\left(\frac{\sigma_p}{\omega}\right))$$

in an insulating dielectric fluid (relative complex permittivity $$\varepsilon_m^* = \varepsilon_m - j\left(\frac{\sigma_m}{\omega}\right))$$

and equation (9) becomes:

$$\vec{F}_{DEP} = 2\pi a^3 \varepsilon_m \big( \mathrm{Re}(f_{CM}) \vec{\nabla} |\vec{E}|^2 + \mathrm{Im}(f_{CM})(E_x^2 \vec{\nabla} \varphi_x + E_y^2 \vec{\nabla} \varphi_x + E_z^2 \vec{\nabla} \varphi_z) \big) \qquad (10)$$

where $$f_{CM} = \frac{\varepsilon_p^* - \varepsilon_m^*}{\varepsilon_p^* + 2\varepsilon_m^*}$$

is the Clausius-Mosotti factor, $\alpha$ is the particle radius and $\phi$ is the electric field phase. So if the particle is more conductive than the medium around it, the dipole aligns with the field and the force acts up the field gradient towards the region of highest electric field.

On the contrary if the particle is less polarizable than the medium, the dipole aligns against the field and particle is repelled from the regions of high electric field. So the force is unaffected by the direction of the electric field, responding only to the field gradient. Since the alignment of the field is irrelevant one could generate the electric field in AC, with the advantage of reducing any electrophoretic force, due to any net particle charge, to zero.

Figure 8A:
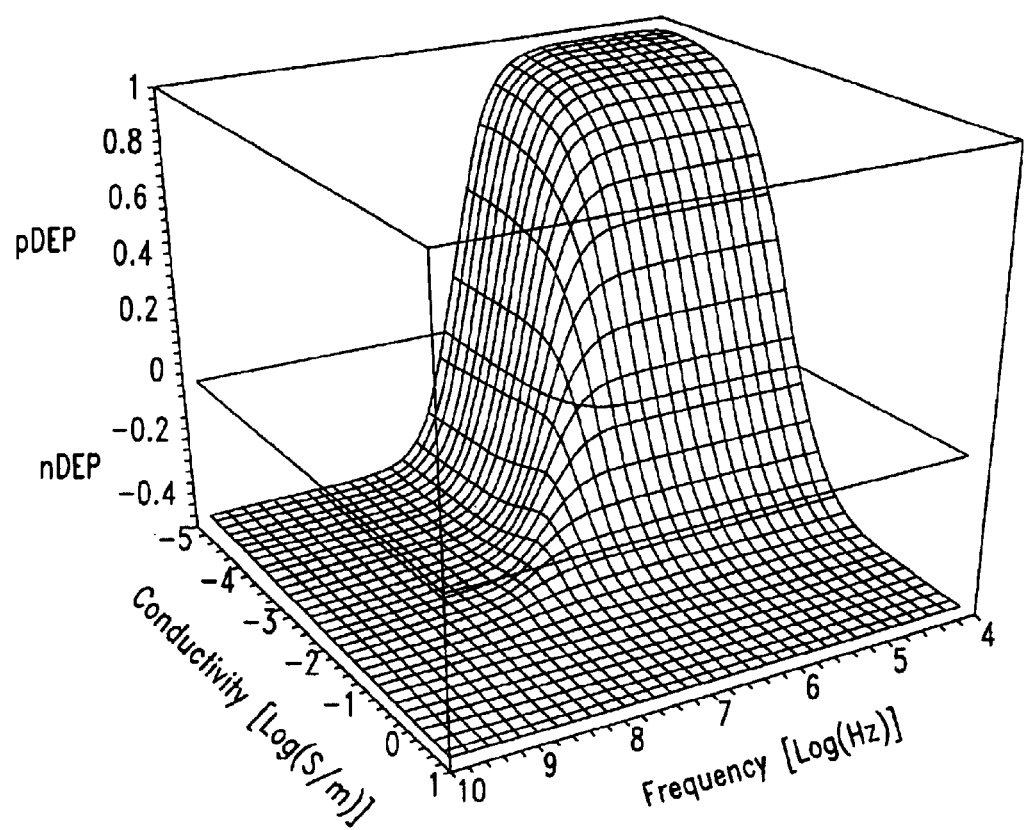
FIGS. 8A and 8B are schematic diagram showing the Real part and Imaginary part of $f_{CM}$ in function of frequency and conductivity.
Figure 8B:
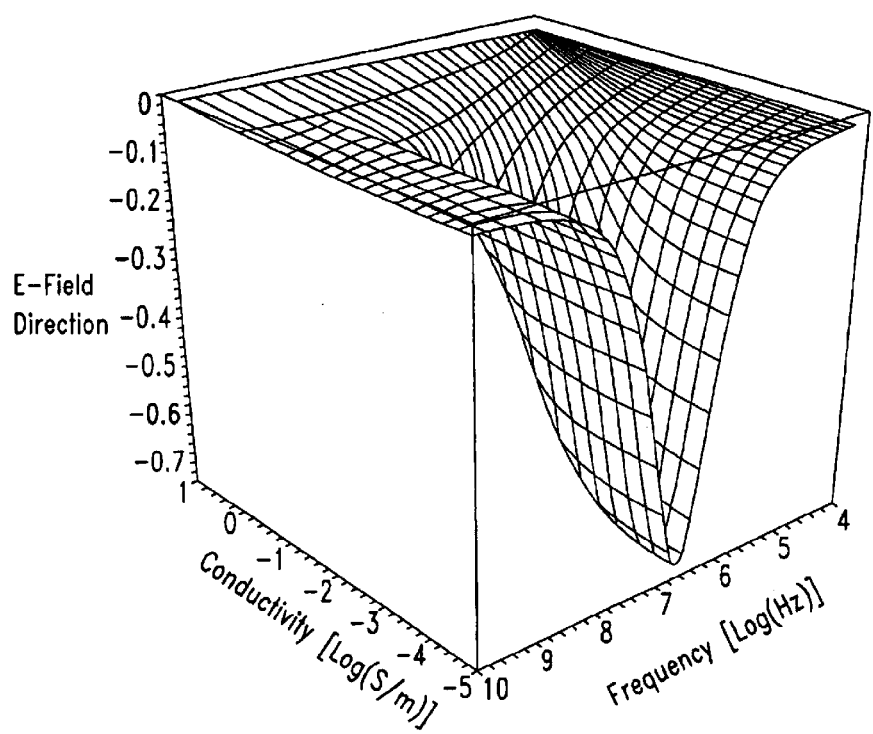

It's worth noting that magnitude of $\vec{F}_{DEP}$ depends on the frequency of the AC electric field, since the real and imaginary part of $f_{CM}$ are very different according to the work frequency (see FIG. 8). It's useful to set the working frequency so as to choose the weight of each of the two contributes of the force, linked to the real or the imaginary part.

So as a result the real component of $f_{CM}$ is usually used to trap the particle, while the imaginary component is for translational particle actuation. The field induced force increase as field gradient becomes stronger. An increase of field gradient can be obtained by miniaturization of the electrodes.

To develop a model in order to control the migration process, in the balance of applied forces it must be considered also the Stokes friction force due to the viscosity of the host fluid as result of the motion of a sphere in it:

$$\vec{W}_R = -6\pi\eta\alpha\vec{v}$$

where $\eta$ is the viscosity of the medium.

Figure 9:
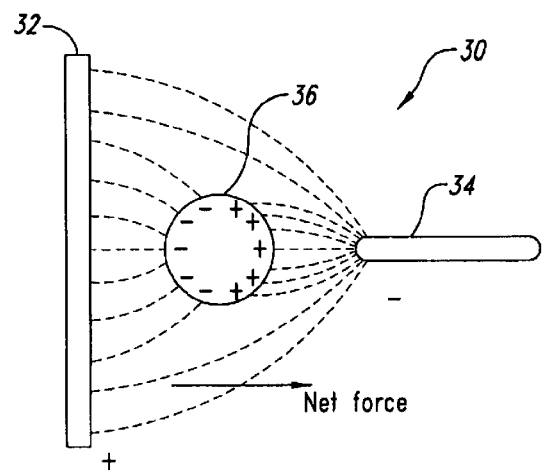
FIG. 9 shows a schema of the electrodes for DEP.

A schematic of a polarizable particle suspended within a point-plane electrode system 30 is shown in the FIG. 9. The system 30 includes a plane electrode 32 and a point electrode 34 with a particle 36. When the particle polarizes, the interaction between the dipolar charges and the local electric field produces a force.

Due to the inhomogeneous nature of the electric field, the force is greater in the side facing the point 34 than that on the side facing the plane 32, and there is net motion towards the point electrode. This effect is called positive dielectrophoresis. If the particle is less polarizable than the surrounding medium, the dipole will align counter to the field and the particle will be repelled from the high field regions, called negative dielectrophoresis.

3. Sintering of the Nanoclusters in a Nanowire.

Figure 10A:
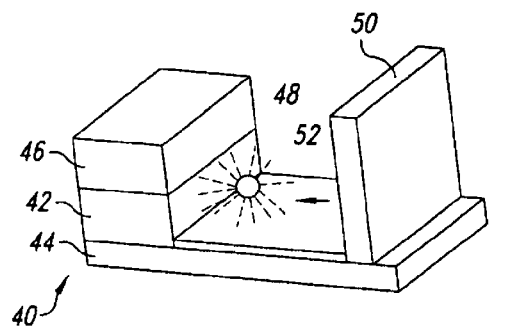
FIGS. 10a–c are schematic views of the steps for nanocontact realization.
Figure 10B:
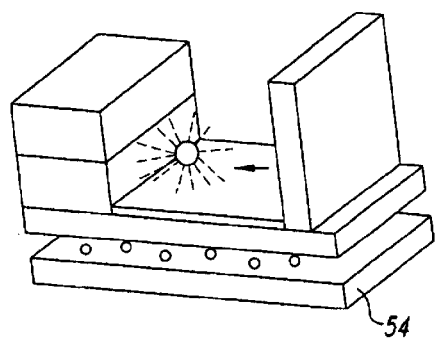
Figure 10C:
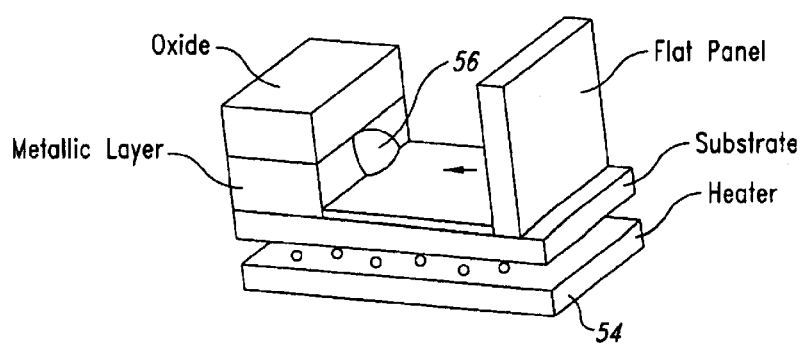

Before the synthesis of a nanowire it is necessary to realize a nanocontact, whose target offers a reference point for the growth of the nanowire as well the electrode towards which the nanoclusters move under the control of the electric field. Firstly the synthesis of a nanotip must be conducted:

A substrate 40 is processed to be patterned, for instance by lithography, to obtain a metallic layer 42 between two oxide layers 44, 46, with a free face 48 available for electro-deposition (FIG. 10a);

When an electric field is applied between a flat panel 50 and the metallic free face 48, a passivated nanocluster 52, whose sizes are comparable to the thickness of the metallic layer, moves to the free face, under dielectrophoresis, and the thioles S—H group linked to it;

The substrate is heated by a heater 54 until the thioles degradation temperature is reached (FIG. 10b); when this occurs the dielectric shell, surrounding the metal core, vanishes leaving a nanoparticle 56 that finds stability joining the free face (FIG. 10c).

The thioles degradation may be performed even by UV treatment.

However, the process may even not require a treatment for thioles shell degradation since for very thin barriers (about nm) the tunneling effect could assure a significant conduction.

The so-created nanocontact is the new reference point for the others nanoclusters since the force lines of the electric field get denser close to a smaller radius curvature region.

Figure 11A:
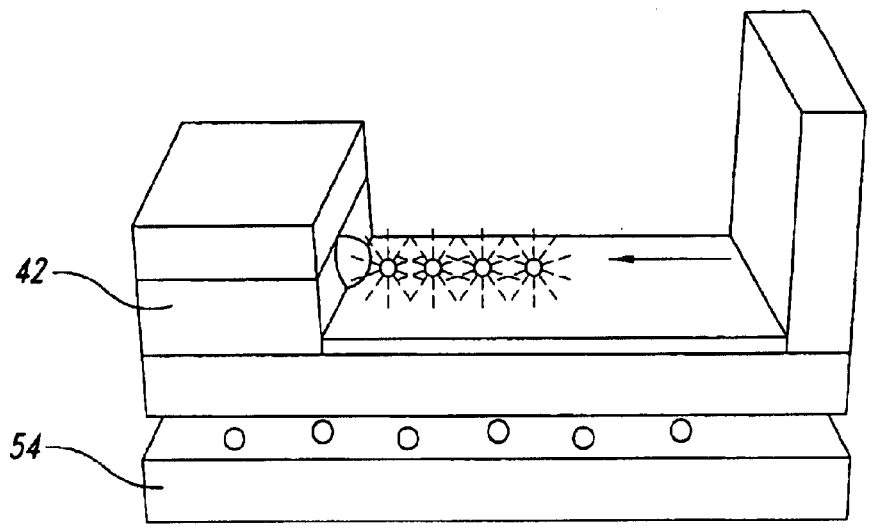
FIG. 11 shows conclusive steps of the process for the realization of a nanowire.
Figure 11B:
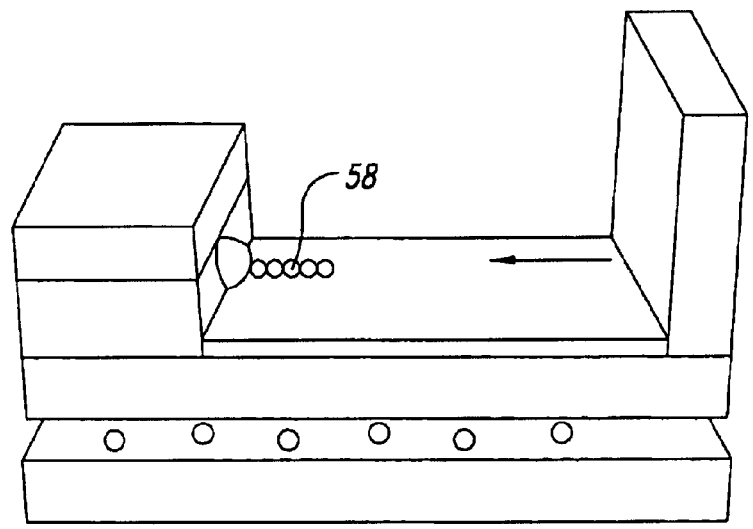

In this new configuration, other small nanoclusters join together as an one-dimensional array; then a new heating produces the degradation of the thioles shells and a nanowire 58 is formed (see FIGS. 11a, b).

It must be noted that according with one embodiment of the present invention, a metallic nanocluster could be deposited for catalytic applications; in other words, to realize catalytic material obtained by dielectric deposition. A possible application for these kind of nanoclusters is the growing of nano-tubes or the use as catalytic loads in polimeric electrodes.

4. Dielectrophoresis Application for SET Device Development

Figure 12:
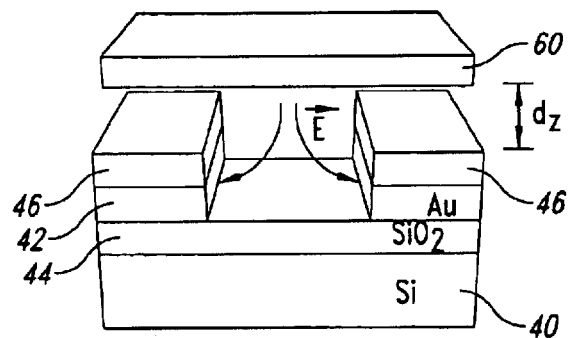
FIG. 12 shows schematically a configuration scheme of a SET microcavity to implement the dielectrophoresis chamber.
Figure 13:
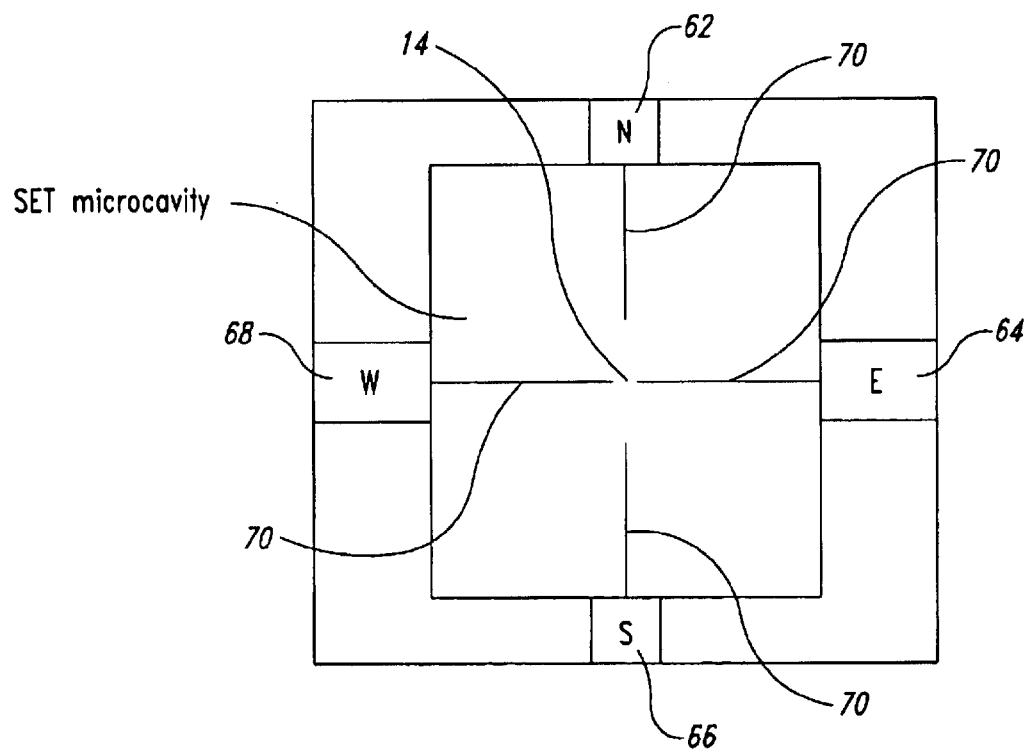
FIG. 13 shows a final structure obtained with the configuration scheme of FIG. 12.

After having dipped the patterned substrate in a solution containing metallic passivated nanoclusters, a flat electrode 60 is suspended parallel to the substrate without contacting it, see for instance FIG. 12. Shown in FIG. 13 is an enlarged view of the central aperture 14 of FIGS. 5a–c. FIG. 13 also shows North, East, South, and West electrodes 62, 64, 66, 68 formed in the paths 16 of FIGS. 5a–c.

The distance between the plate electrode 60 and the substrate is one of the design parameters which allows to control the curvature of the force lines of the electric field and so the dielectrophoresis force as well as the potential applied to it. In detail, a potential difference is applied between the four electrodes 62–68, held to the same potential, and the plate-electrode 60: the configuration of the electrodes is chosen so as to let the absolute root value of the electric field have its maximum next to the free face of the four electrodes 62–68 facing the aperture.

In this way metallic nanoclusters are obliged to migrate towards the free faces of the four electrodes and to self-assembly in the direction perpendicular to those faces. Then nanowires 70 are generated and represent a powerful matter to link the nanometric world of the quantum dot to the macroscopic easily managed world of the patterned electrodes The ability to control precisely the process of self-assembly nanoclusters is therefore depending on the uniformity of the electric field between the top electrode 60, acting as flat panel, and the four electrodes 62–68 where the nanoclusters are self-assembled.

According to this fact, a microfabrication approach is outlined and embedded in the standard fabrication process, which is intended to obtain an integrated SET microcavity in order to guarantee the possibility to act a fine control of the distance ($d_z$) between the top electrode 60 and the substrate 40 as well as the control of its shape.

The aperture 14 is chosen rectangular since the distance between N—S electrodes 62, 66 must be bigger than the distance between the E-W electrodes 64, 68: this is necessary to realize couples of wires 70 of different length (see FIG. 13). In fact the E-W electrodes 64, 68 distance can be of the order of 10 nm since the gap between them is the location of a metallic passivated nanocluster acting as quantum dot. After nanowires fabrication, the maximum value of the electric field absolute root lets a nanocluster occupy the gap and the SET structure is complete.

This architecture including four terminal electrodes 62–68 may be used as an AND/OR logic gate.

A typical size for the aperture 14 of the SET microcavity is 90×150 $nm^2$ (that can be obtained for instance by conventional lithography techniques) and 30 nm for electrodes width so that, if the nanowires 70 are developed with a final length of about 40 nm, it will results in a E-W electrodes 64, 68 distance of about 10 nm and a N-S electrodes 62, 66 distance of about 70 nm.

A typical example of process flow-chart to build up the SET microcavity with an integrated top electrode is reported in the scheme sequence of FIGS. 14–18, which is only intended as a possible realization scheme not exhaustive of the possible alternative realizations.

The process of FIGS. 14–18 begins similarly to the process of FIGS. 5a–c with the formation of a thin $SiO_2$ layer 12 on a silicon substrate 10 in FIG. 14. Then, instead of etching a central aperture 14 and contact paths 16 in the $SiO_2$ layer 12 as in FIGS. 5a–c, the process deposits aluminum or other metal contacts 72 on the $SiO_2$ layer 12 and forms a central aperture 74 between the contacts 72 in FIG. 15. Next, a silicon nitride sacrificial layer 76 is formed in the central aperture 74 and on portions of the contacts 72 in FIG. 16. The thin $SiO_2$ layer 12 is grown to form a thick $SiO_2$ layer 78 laterally of the silicon nitride sacrificial layer and on the contacts 72 in FIG. 17. The silicon nitride sacrificial layer 76 is removed and the upper plate electrode 60 is formed on the thick $SiO_2$ layer 78 and above the central aperture 74 in FIG. 18. Then, the nanowires 70 are formed according to the dielectrophoretic process described above with respect to FIGS. 12–13 to form an SET device 80.

Analogously, the process can easy be extended to integrate more than one Single Electron Devices in a single microcavity as well as to integrate both SET devices with conventional components and circuits (for example to integrate the signal amplifiers and conditioning circuits, as well as to develop a buried resistor grid which will act as the heater for the thioles degradation in the final steps of the nanowires realization).

All these possibilities are intended as an extension of the basic idea, suitable to develop a hybrid nanotechnology and nanofabrication approach to develop novel SET-based circuits working at room temperature.

It is worth noting that from the basic four-electrodes patterned substrate it is possible to build up SET device of different kind depending on the material used to realize either the four nanowires or the "quantum dot island".

Then possible choices involve the employment of metallic CNT or any organic conductive material (polythiophene based-molecule) as nanowires, while as quantum dot one could use either a metallic or semiconductive material according to the desired properties and applications. Another possible choice, for the dot, involves the use of treated carbon structures ($C_{60}$ based molecules) or Si clusters surrounded by a $SiO_2$ dielectric shell.

The methods described above do solve problems of the prior art and achieve various advantages and benefits.

An important benefit of this process is the possibility to realize controllable length and width nanowires overcoming the limits of the past techniques. The invention allows the development of new family of nanoelectronic devices easily and cheaply.

Employing this technique, one can build up basic single-electron devices (SE-box, SE-transistor, SE Turnstile and pump, SE transistor oscillators), analog application (supersensitive electrometry, SE spectroscopy, CD current standards, temperature standards, resistance standards, detection of infrared radiation) and digital application (voltage state logics, charge state logics, SET/FET memory, NOVAROM).

The proposed structure can be used either as a SET device, driving both the gates with the same control signal, or as a logic gate, driving each gate with a suitable digital signal. In particular the latter can be used either as an OR or as an AND gate, depending on the signal value applied at each gate electrode.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for manufacturing a single electron device, comprising:
    patterning a substrate;
    providing passivated metallic nanoclusters; and
    electro-migrating the passivated metallic nanoclusters by forcing the passivated metallic nanoclusters to assemble over the patterned substrate under control of a non-homogeneous electric field.

2. The method according to claim 1 wherein the electro-migrating step and a desired location of the metallic passivated nanoclusters are controlled by a dielectrophoretic process.

3. The method according to claim 1 including:
    synthesizing passivated metallic nanoclusters surrounded by a dielectric shell of thiols of controlled size;
    depositing the passivated metallic nanoclusters by dielectrophoresis, wherein the passivated metallic nanoclusters join together in a one-dimensional array; and
    sintering the one-dimensional array to desorb the dielectric shell and provide a nanowire.

4. The method according to claim 3 wherein said synthesizing step includes:
    synthesizing active metal to produce a metallic suspension comprising metallic nanoclusters;
    superficially passivating the metallic nanocluster with thiol to provide passivated metallic nanoclusters; and
    extracting and purifying the thiol-passivated metallic nanoclusters.

5. The method according to claim 4 wherein said step of synthesizing the active metal includes:
    $1^{st}$ stage Crystallized metal compound→intermediate phase
        progressively dissolving a metal compound in a polyol to form a first solution;
        precipitating an intermediate phase from said first solution; and
        removing water by distillation from said intermediate phase;
    $2^{nd}$ stage Intermediate phase→metal
        dissolving the intermediate phase in a polyol to form a second solution;
        reducing the intermediate phase in solution;
        removing volatile products of reaction; and
        spontaneously nucleating and growing metallic nanoclusters from said second solution.

6. The method according to claim 4 wherein said step of superficially passivating a metal with thiol includes cooling the metallic suspension and treating it at room temperature with a dodecanthiol ($CH_3(CH_2)_{11}SH$) solution or with a thiol excess ($CH_3(CH_2)_nSH$).

7. The method according to claim 4 wherein said extracting step includes separating said metallic nanoclusters by extraction with hydrocarbon (wet-way process).

8. The method according to claim 1 wherein the electro-migrating step forces the passivated metallic nanoclusters to assemble into a nanowire over said patterned substrate by forming a nanocontact under control of the electric field, and using the nanocontact as a target that offers a reference point for growing said nanowire by moving the nanoclusters under the control of the electric field.

9. The method according to claim 8 wherein said step of forming a nanocontact comprising:
    patterning a substrate to obtain a metallic layer between two oxide layers, with a free face of the metallic layer being available for electro deposition; applying the electric field between a flat panel and the metallic free face, to cause one of the passivated nanoclusters, having a size comparable to a thickness of the metallic layer and being passivated with a dielectric shell of thiols, to move to the free face, under dielectrophoresis; and
    heating the substrate until a degradation temperature of the thiols is reached, thereby causing the dielectric shell, surrounding a metal core of the one of the passivated nanoclusters, to vanish and leave a nanoparticle that finds stability by joining the free face.

10. The method according to claim 1 wherein the electro-migrating step is performed at room temperature.

11. A method of manufacturing a nanocluster device, comprising:
    forming conductive nanoparticles; and
    forming a nanocluster contact at a first electrode by forcing the conductive nanoparticles to the first electrode under control of a non-homogeneous electric field produced by a second electrode.

12. The method of claim 11, further comprising:
    passivating the conductive nanoparticles with dielectric shells; and
    heating the conductive nanoparticles to remove the dielectric shells after the passivated nanoparticles are forced to the first electrode.

13. The method of claim 12 wherein the passivating step includes superficially passivating the conductive nanoparticles with thiol and extracting and purifying the thiol-passivated nanoparticles.

14. The method of claim 11 wherein forming the conductive nanoparticles includes:
    progressively dissolving a crystallized metal compound
    precipitating an intermediary phase;
    evolving water by distilling the intermediate phase;
    dissolving the intermediate phase;
    reducing the intermediate phase in solution;
    evolving volatile products of reaction; and
    spontaneously nucleating and growing the metallic nanoparticles.

15. The method of claim 13 wherein the step of superficially passivating the conductive nanoparticles with thiol includes cooling a metallic suspension comprising the conductive nanoparticles and treating said metallic suspension at room temperature with a dodecanthiol ($CH_3(CH_2)_{11}SH$) solution or with a thiol excess ($CH_3(CH_2)_nSH$).

16. The method of claim 1 wherein the electro-migrating steps includes forming on an electrode a nanocontact under control of the electric field, and thus using the nanocontact as a target that offers a reference point for growing a nanowire by moving the nanoclusters under the control of the non-homogeneous electric field.

17. The method according to claim 11, further comprising:
    forming a substrate that includes an upper, first dielectric layer;
    forming the first electrode on the first dielectric layer;
    forming a second dielectric layer on the first electrode and having an opening that exposes a free face of the first electrode; and
    forming the second electrode facing the opening in the second dielectric layer.

18. The method of claim 5 wherein said metal compound is a metal hydroxide, metal oxide or metal salt.

19. The method of claim 5 wherein the polyol is ethylene glycol (EG) or diethylene glycol (DEG).

20. The method of claim 4 wherein the step of superficially passivating said metallic nanoclusters comprises:
    suspending said metallic nanoclusters in a third solution; and
    adding thiol compounds to said third solution wherein the thiol compounds are chemically absorbed to surfaces of the metallic nanoclusters.

21. The method of claim 20 wherein the thiol compounds are dodecanthiol ($CH_3(CH_2)_{11}SH$) or a thiol excess having the formula $CH_3(CH_2)_nSH$, wherein n is an integer.

22. The method of claim 21 wherein n is an integer between 2–30.

23. The method of claim 20 wherein said third solution comprises polyvinylpoyrrolidone (PVP) as a reducing agent and inhibitor of aggregation processes of the nanoclusters.

24. The method according to claim 4 wherein said extracting step includes separating said passivated metallic nanoclusters by adding water following filtration (dry-way process).

25. The method of claim 4 wherein the purification process including:
    dissolving the extracted passivated metallic nanoclusters in ethyl alcohol,
    adding acetone to precipitate the passivated metallic nanoclusters,
    separating the passivated metallic nanoclusters by centrifugation; and
    drying the passivated metallic nanoclusters.

26. The method of claim 9 wherein the step of patterning the substrate comprises forming a plurality of electrodes surrounding a central aperture, each electrode having an opening exposing a free face.

27. The method of claim 26 wherein the central aperture is rectangular and the electrodes are substantially centrally located with respect to the sides of the central aperture.

28. The method of claim 26 further comprising applying a potential difference between the plurality of electrodes and a plate electrode, held to a same potential, wherein, the passivated metallic nanoclusters are obliged to migrate towards the free faces of said electrodes and to self-assemble perpendicular to the free faces and forming a plurality of nanowires.

29. The method according to claim 28 wherein said step of forming said nanowires leave a gap between the nanowires defining a location for a quantum dot as single electron components.

30. The method according to claim 29 wherein the step of applying said electric field allows a nanoclusters occupy said gap as a quantum dot.

31. A method of manufacturing a single electron device, comprising:
    patterning a substrate to provide an integrated microcavity, said integrated microcavity being substantially rectangular and surrounded on four sides by metal contacts, and
    forming a nanowire within the integrated microcavity.

32. The method of claim 31 wherein said step of forming an integrated microcavity including:
    forming a thin silicon oxide layer on a silicon substrate;
    depositing metal contacts on said silicon oxide layer, in such a way to form a central aperture between said metal contacts;
    forming a sacrificial layer to fill said central aperture and to cover at least portions of said metal contacts;
    growing said thin silicon oxide layer to form a thick silicon oxide layer laterally of said sacrificial layer and on said metal contacts; and
    removing said sacrificial layer to provide said integrated microcavity.

33. The method of claim 32 further comprising forming a plate electrode on said thick silicon oxide layer and above said central aperture to close said integrated microcavity.

34. The method of claim 31 wherein the step of forming a nanowire within the integrated microcavity comprises:
    providing passivated metallic nanoclusters having thiol dielectric shells,
    causing one passivated metallic nanocluster to move to a free face of one of the metal contact to provide a nanocontact under control of dielectrophoresis;
    heating the substrate to degrade the thiol dielectric shell of the nanocontact, thereby attaching the passivated metallic nanocluster to the free face;
    forming the nanowire under dielectrophoresis by forcing the passivated metallic nanoclusters to migrate and assemble into a one-dimensional array between the nanocontact and a free face of an opposite metal contact; and
    heating the substrate to degrade the thiol dielectric shell of each passivated metallic nanoclusters.

35. The method of claim 31 wherein the forming step includes applying a non-homogeneous electric field to cause the passivated metallic nanoclusters to migrate within the integrated microcavity.

* * * * *

UNITED STATES PATENT AND TRADEMARK OFFICE
CERTIFICATE OF CORRECTION

| | | |
|---|---|---|
| PATENT NO. | : 7,067,341 B2 | Page 1 of 1 |
| APPLICATION NO. | : 10/695479 | |
| DATED | : June 27, 2006 | |
| INVENTOR(S) | : Danilo Mascolo et al. | |

It is certified that error appears in the above-identified patent and that said Letters Patent is hereby corrected as shown below:

Column 13
Line 66, "$(CH_3(CH_2)_{11}\ SH)$" should read as --$(CH_3(CH_2)_{11}SH)$-- .

Column 14
Line 61, "nanonarticles" should read as --nanoparticles--.

Signed and Sealed this

First Day of May, 2007

JON W. DUDAS
*Director of the United States Patent and Trademark Office*